(12) United States Patent
Iida et al.

(10) Patent No.: US 8,633,617 B2
(45) Date of Patent: Jan. 21, 2014

(54) FILTER CIRCUIT AND COMMUNICATION APPARATUS

(75) Inventors: Sachio Iida, Chiba (JP); Atsushi Yoshizawa, Kanagawa (JP)

(73) Assignee: Sony Corporation, Tokyo (JP)

(*) Notice: Subject to any disclaimer, the term of this patent is extended or adjusted under 35 U.S.C. 154(b) by 118 days.

(21) Appl. No.: 12/757,744

(22) Filed: Apr. 9, 2010

(65) Prior Publication Data

US 2010/0264751 A1 Oct. 21, 2010

(30) Foreign Application Priority Data

Apr. 21, 2009 (JP) ................................ P2009-103165

(51) Int. Cl.
*H03K 5/00* (2006.01)
*H03H 7/00* (2006.01)

(52) U.S. Cl.
USPC .......................................... 307/109; 327/337

(58) Field of Classification Search
USPC .......................................... 307/109; 327/337
See application file for complete search history.

(56) References Cited

U.S. PATENT DOCUMENTS

| | | | | |
|---|---|---|---|---|
| 4,322,697 A | * | 3/1982 | Carbrey | 333/173 |
| 5,724,000 A | * | 3/1998 | Quinn | 327/554 |
| 6,084,465 A | * | 7/2000 | Dasgupta | 327/554 |
| 6,147,522 A | * | 11/2000 | Rhode et al. | 327/93 |
| 6,414,541 B1 | * | 7/2002 | Arvidsson et al. | 327/554 |
| 6,570,519 B1 | * | 5/2003 | Yang | 341/143 |
| 6,624,779 B2 | * | 9/2003 | Hochschild | 341/172 |
| 7,239,196 B2 | * | 7/2007 | Hasegawa | 327/552 |
| 7,636,012 B2 | * | 12/2009 | Iida | 327/554 |
| 7,671,658 B2 | * | 3/2010 | Harada et al. | 327/355 |
| 7,907,004 B2 | * | 3/2011 | Yoshizawa et al. | 327/554 |
| 7,932,773 B2 | * | 4/2011 | Iida et al. | 327/551 |
| 7,965,135 B2 | * | 6/2011 | Yoshizawa et al. | 327/554 |
| 7,973,586 B2 | * | 7/2011 | Hosokawa et al. | 327/355 |
| 8,067,972 B2 | * | 11/2011 | Iida et al. | 327/337 |
| 8,089,310 B2 | * | 1/2012 | Iida et al. | 327/551 |
| 2001/0033240 A1 | * | 10/2001 | Ueno et al. | 341/143 |
| 2002/0172170 A1 | * | 11/2002 | Muhammad et al. | 370/335 |
| 2003/0040294 A1 | * | 2/2003 | Staszewski et al. | 455/337 |
| 2003/0050027 A1 | * | 3/2003 | Muhammad et al. | 455/257 |
| 2006/0006931 A1 | * | 1/2006 | Hsieh et al. | 327/554 |
| 2007/0275684 A1 | * | 11/2007 | Harada et al. | 455/185.1 |
| 2008/0007326 A1 | | 1/2008 | Iida | |
| 2008/0088389 A1 | * | 4/2008 | Iida | 333/167 |
| 2008/0123614 A1 | * | 5/2008 | Iida | 370/343 |
| 2009/0015306 A1 | * | 1/2009 | Yoshizawa et al. | 327/231 |
| 2009/0021297 A1 | * | 1/2009 | Yoshizawa et al. | 327/554 |
| 2009/0160577 A1 | * | 6/2009 | Yoshizawa et al. | 333/174 |
| 2009/0161801 A1 | * | 6/2009 | Huang et al. | 375/344 |

* cited by examiner

FOREIGN PATENT DOCUMENTS

| | | |
|---|---|---|
| JP | 2008-17220 | 1/2008 |
| JP | 2009-27389 | 2/2009 |

*Primary Examiner* — Adi Amrany
(74) *Attorney, Agent, or Firm* — Finnegan, Henderson, Farabow, Garrett & Dunner, LLP

(57) ABSTRACT

A filter circuit according to the present invention includes a voltage-current conversion unit that converts a voltage signal input to an input end to a current signal, a capacitor group that is made up of a plurality of capacitors, where the current signal output from the voltage-current conversion unit is sequentially input to each capacitor at every cycle, a first switch that connects a set of capacitors to which the current signal is input with each other and adds charges accumulated in the set of capacitors together, and a second switch that connects at least one capacitor of the set of capacitors to an output end after charges are added by the first switch.

15 Claims, 10 Drawing Sheets

FILTER CIRCUIT AND COMMUNICATION APPARATUS

BACKGROUND OF THE INVENTION

1. Field of the Invention

The present invention relates to a filter circuit and a communication apparatus.

2. Description of the Related Art

As the scaling-down of a complementary metal-oxide semiconductor (CMOS) process, a power supply voltage of a radio frequency (RF) circuit is on the decrease. If an RF circuit is mounted by a circuit technique used hitherto under circumstances where the CMOS process is scaled down, there is a problem that a voltage margin is insufficient and the dynamic range of a signal amplitude is narrow. On the other hand, because the cutoff frequency of a transistor increases by the scaling-down of the CMOS process, there is an advantage that it is suitable for an operation of performing high-speed switching accurately with respect to time. There is also an advantage that the capacitance ratio is exact because the accuracy of lithography increases.

In order to gain the above advantages by avoiding the problem caused by the scaling-down of the CMOS process, novel technology that applies the concept of discrete-time signal processing to the RF circuit is developed, which is digital RF technology. A major circuit in the digital RF technology is a charge domain filter. The charge domain filter is a filter circuit that is composed of a transconductance amplifier, switches and capacitors. The charge domain filter performs sampling of an analog signal by conducting charge and discharge in synchronization with a clock and thereby performs filtering, decimation or the like by discrete-time signal processing. Such technology is disclosed in Japanese Unexamined Patent Application Publications Nos. 2008-17220 and 2009-27389, for example.

SUMMARY OF THE INVENTION

In the charge domain filter, however, when conducting charge and discharge in synchronization with a clock, there is a problem that an output waveform is affected by a transient phenomenon during movement of charge. Particularly, assuming a filter with a structure that adds charges of a plurality of capacitors together and discharges the sum charge, fluctuations in a waveform due to a transient phenomenon during charge addition appear in an output waveform, which causes a failure in ensuring suitable filter characteristics.

In light of the foregoing, it is desirable to provide a novel and improved filter circuit and communication apparatus that enable suppression of the effect of a transient phenomenon arising from movement of charge on output.

According to an embodiment of the present invention, there is provided a filter circuit includes a voltage-current conversion unit that converts a voltage signal input to an input end to a current signal, a capacitor group that is made up of a plurality of capacitors, where the current signal output from the voltage-current conversion unit is sequentially input to each capacitor at every cycle, a first switch that connects a set of capacitors to which the current signal is input with each other and adds charges accumulated in the set of capacitors together, and a second switch that connects at least one capacitor of the set of capacitors to an output end after charges are added by the first switch.

In this configuration, the number of capacitors making up the set of capacitors is N, and the number of the first switch is N−1.

In this configuration, the filter circuit further includes a third switch that inputs the current signal output from the voltage-current conversion unit sequentially to each capacitor of the capacitor group at every cycle, and a fourth switch that deletes charge accumulated in each capacitor sequentially at every cycle.

According to another embodiment of the present invention, there is provided communication apparatus including a filter circuit includes a voltage-current conversion unit that converts a voltage signal input to an input end to a current signal, a capacitor group that is made up of a plurality of capacitors, where the current signal output from the voltage-current conversion unit is sequentially input to each capacitor at every cycle, a first switch that connects a set of capacitors to which the current signal is input with each other and adds charges accumulated in the set of capacitors together, and a second switch that connects at least one capacitor of the set of capacitors to an output end after charges are added by the first switch.

According to the embodiments of the present invention described above, it is possible to suppress the effect of a transient phenomenon arising from movement of charge on output.

DETAILED DESCRIPTION OF THE EMBODIMENT(S)

Figure 1:
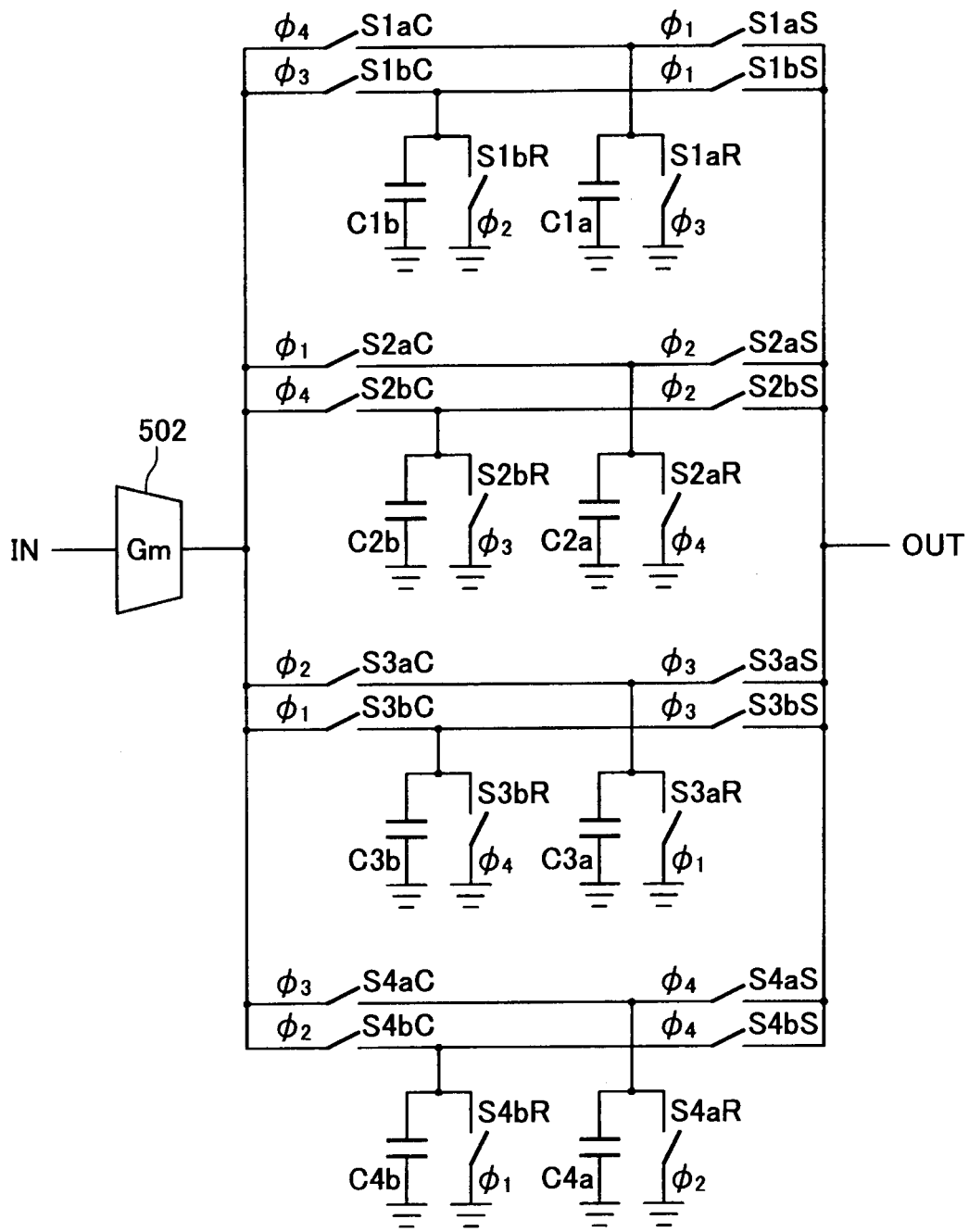
FIG. 1 is a circuit diagram showing a 2-tap FIR filter as an example of a charge domain FIR filter.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

The description will be given in the following order.
1. First Embodiment (An example of a 2-tap charge domain FIR filter)
   (1) Underlying Technology
   (2) Structure and Operation of Filter Circuit According to First Embodiment
2. Second Embodiment (An example of a structure simplified by the commonality of Share switches)
3. Third Embodiment (An example of an N-tap charge domain FIR filter)
4. Fourth Embodiment (An example of a communication apparatus including a filter circuit according to each embodiment)

1. First Embodiment

(1) Underlying Technology

A charge domain FIR filter is described hereinafter as technology underlying a charge domain filter according to the embodiment. FIG. 1 is a circuit diagram showing a 2-tap FIR filter 500 as an example of a charge domain FIR filter. The structure and the operation of the 2-tap FIR filter 500 shown in FIG. 1 are described hereinbelow.

In FIG. 1, IN is an input terminal, and OUT is an output terminal. A Gm 502 is a transconductance amplifier that converts a voltage signal applied to the input terminal IN to a current signal and outputs the signal. Eight sampling capacitors C1$a$, C1$b$, C2$a$, C2$b$, C3$a$, C3$b$, C4$a$ and C4$b$, which constitute a capacitor group, are connected in parallel to the output end of the Gm 502. The sampling capacitors C1$a$, C1$b$, C2$a$, C2$b$, C3$a$, C3$b$, C4$a$ and C4$b$ all have the same capacitance C.

Reset switches S1$a$R, S1$b$R, S2$a$R, S2$b$R, S3$a$R, S3$b$R, S4$a$R and S4$b$R are connected respectively to the sampling capacitors C1$a$, C1$b$, C2$a$, C2$b$, C3$a$, C3$b$, C4$a$ and C4$b$. Further, Charge switches S1$a$C, S1$b$C, S2$a$C, S2$b$C, S3$a$C, S3$b$C, S4$a$C and S4$b$C are connected respectively to the sampling capacitors C1$a$, C1$b$, C2$a$, C2$b$, C3$a$, C3$b$, C4$a$ and C4$b$. Furthermore, Share switches S1$a$S, S1$b$S, S2$a$S, S2$b$S, S3$a$S, S3$b$S, S4$a$S and S4$b$S are connected respectively to the sampling capacitors C1$a$, C1$b$, C2$a$, C2$b$, C3$a$, C3$b$, C4$a$ and C4$b$. In this manner, three kinds of switches, i.e. the Reset switch, the Charge switch and the Share switch, are connected to each of the sampling capacitors C1$a$, C1$b$, C2$a$, C2$b$, C3$a$, C3$b$, C4$a$ and C4$b$.

The Reset switch, the Charge switch and the Share switch shown in FIG. 1 are driven by clocks Φ1 to Φ4 indicated for the respective switches in FIG. 1 and turn ON at the time when the clocks Φ1 to Φ4 become Hi-level. For example, the Share switches S1$a$S and S1$b$S turn ON at the time phase when the clock Φ1 becomes Hi-level. Further, the Charge switch S1$b$C turns ON at the time phase when the clock Φ3 becomes Hi-level, and the Charge switch S1$a$C turns ON at the time phase when the clock Φ4 becomes Hi-level.

Figure 2:
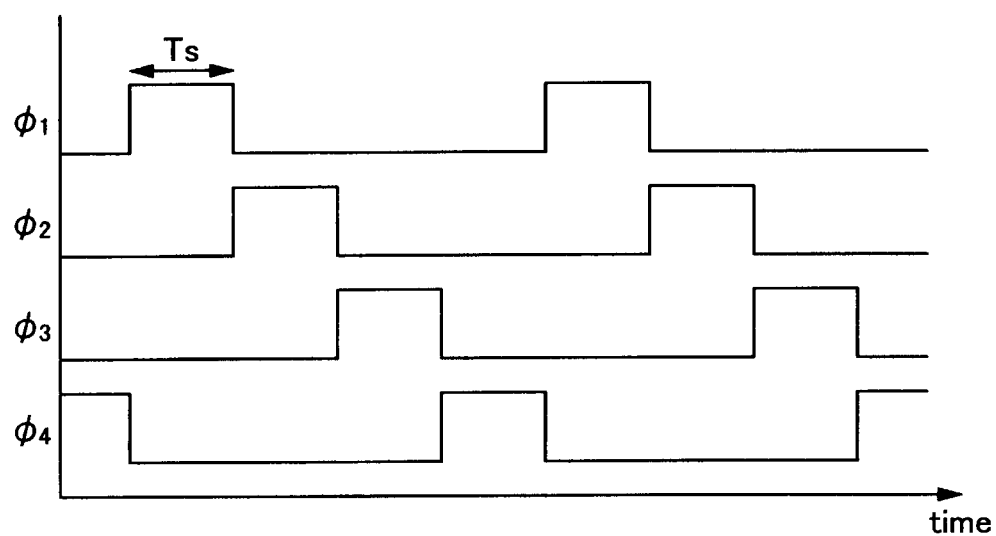
FIG. 2 is a timing chart showing timing when clocks $\Phi1$ to $\Phi4$ become a high level.

FIG. 2 is a timing chart showing timing when the clocks Φ1 to Φ4 become Hi-level. Referring to FIG. 2, the clocks Φ1 to Φ4 are driven so as to sequentially turn on for a period Ts.

Each switch turns ON at the time phase when the clocks Φ1 to Φ4 shown in FIG. 2 become Hi-level. Each sampling capacitor enters any one of Reset state, Charge state and Share state at the time phase when one of the three kinds of switches connected to the sampling capacitor turns ON. Specifically, each sampling capacitor enters the Reset state at the time phase when the Reset switch connected to the sampling capacitor turns ON. Further, each sampling capacitor enters the Charge state at the time phase when the Charge switch connected to the sampling capacitor turns ON, and enters the Share state at the time phase when the Share switch connected to the sampling capacitor turns ON. Further, each sampling capacitor enters Hold state at the time phase when all switches connected to the sampling capacitor turn OFF.

Figure 3:
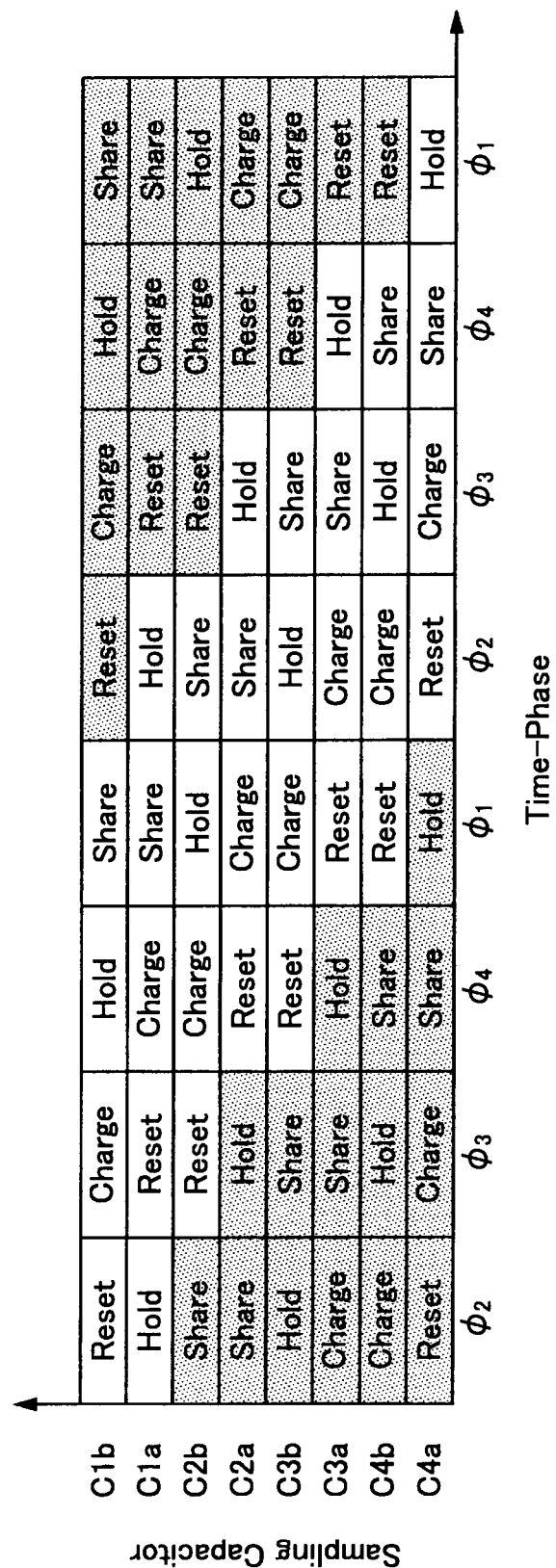
FIG. 3 is a schematic view showing a relationship between a time phase and a state in each sampling capacitor.

FIG. 3 is a schematic view showing a relationship between a time phase and a state in each sampling capacitor, in which the vertical axis indicates sampling capacitors and the horizontal axis indicates time phases when Φ1 to Φ4 become Hi. Hereinafter, the circuit operation is described by using a set of sampling capacitors C2$b$ and C2$a$ as an example. First, referring to FIG. 3 for the state of the sampling capacitor C2$b$, the Reset switch S2$b$R turns ON at the time when the clock Φ3 becomes Hi, and the sampling capacitor C2$b$ enters the Reset state. The charge heretofore accumulated in the sampling capacitor C2$b$ is thereby discharged. Next, when the Charge switches S2$b$C and S1$a$C. turn ON at the time when the clock Φ4 becomes Hi, the sampling capacitor C2$b$, together with the sampling capacitor C1$a$, enters the Charge state. In this state, only the sampling capacitor C1$a$ and the sampling capacitor C2$b$ enter the Charge state among all sampling capacitors shown in FIG. 3. Therefore, one half of the current supplied from the Gm 502 flows into the sampling capacitor C2$b$, and the other half of the current flows into the sampling capacitor C1$a$. Charge is thereby accumulated in the sampling capacitors C2$b$ and C1$a$. Then, at the time when the clock Φ1 becomes Hi, all of the switches S2$b$R, S2$b$C and S2$b$S that are connected to the sampling capacitor C2$b$ turn OFF, and the sampling capacitor C2$b$ enters the Hold state. The charge accumulated in the sampling capacitor C2$b$ is thereby held. After that, at the time when the clock Φ2 becomes Hi, the Share switches S2$a$S and S2$b$S turn ON, and the sampling capacitor C2$b$, together with the sampling capacitor C2$a$, enters the Share state. The two sampling capacitors C2$b$ and C2$a$ are thereby coupled, the charges accumulated in the two sampling capacitors C2$b$ and C2$a$ are added together, and a signal is output from the output terminal OUT.

Likewise, the sampling capacitor C2$a$ enters the Reset state when the Reset switch S2$a$R turns ON at the time when the clock Φ4 becomes Hi. The charge heretofore accumulated in the sampling capacitor C2$a$ is thereby discharged. Next, when the Charge switches S2$a$C and S3$b$C turn ON at the time when the clock Φ1 becomes Hi, the sampling capacitor C2$a$, together with the sampling capacitor C3$b$, enters the Charge state, and one half of the current supplied from the Gm 502 flows into the sampling capacitor C2$a$. Charge is thereby accumulated in the sampling capacitor C2$a$. Then, at the time when the clock Φ2 becomes Hi, the Share switches S2$a$S and S2$b$S turn ON, and the sampling capacitor C2$a$, together with the sampling capacitor C2$b$, enters the Share state. The two sampling capacitors C2$a$ and C2$b$ are thereby coupled, the charges accumulated in the two sampling capacitors C2$a$ and C2$b$ are added together, and a signal is output from the output terminal OUT. After that, at the time when the clock Φ3 becomes Hi, all of the switches S2$a$R, S2$a$C and S2$a$S that are connected to the sampling capacitor C2$a$ turn OFF, and the sampling capacitor C2$a$ enters the Hold state. The charge accumulated in the sampling capacitor C2$a$ is thereby held.

The circuit of the FIR filter 500 shown in FIG. 1 has a structure called a parallel cyclic type circuit, and the same state transition is executed in the other sets of sampling capacitors (capacitors C1$a$ and C1$b$, C3$a$ and C3$b$, and C4$a$ and C4$b$) by shifting the time phase. Then, any of the sampling capacitor pairs C1 to C4 is connected to the output terminal OUT of the FIR filter 500, so that charge is output continuously without a break.

As shown in FIG. 3, in the Share state, the charge accumulated one clock before and the charge accumulated two clocks before are added together. For example, at the clock Φ2 when the sampling capacitors C2a and C2b enter the Share state, the charge accumulated in the capacitor C2a at the clock Φ1, which is one clock before, and the charge accumulated in the capacitor C2b at the clock Φ4, which is two clocks before, are added together. On the other hand, in the Charge state, the sampling capacitor C2a is charged together with the sampling capacitor C3b at the clock Φ1, and the sampling capacitor C2b is charged together with the sampling capacitor C1a at the clock Φ4. In this manner, the two capacitors which are added together in the Share state and the two capacitors which are charged at the same time are different.

In the Share state, ½ of the current supplied from the Gm 502 is accumulated as charge in each sampling capacitor, and therefore the output charge is represented by the following expression 1:

$$Qout(n) = \frac{Qin(n-1)}{2} + \frac{Qin(n-2)}{2} \quad \text{[Expression 1]}$$

In the above expression 1, Qout(n) is charge output from the output terminal OUT at a time phase with a clock n. Qin(n−1) indicates charge supplied from the Gm 502 at a time phase with a clock n−1. Because ½ of the charge supplied from the Gm 502 is accumulated in each sampling capacitor, the charge output from the time phase with the clock n is Qin(n−1)/2, of the charge supplied from the Gm 502 at the time phase with n−1. Further, Qin(n−2) indicates charge supplied from the Gm 502 at a time phase with a clock n−2. Because ½ of the charge supplied from the Gm 502 is accumulated in each sampling capacitor, the charge output at the time phase with the clock n is Qin(n−2)/2, of the charge supplied from the Gm 502 at the time phase with n−2. Thus, the charge output from the output terminal OUT at the time phase with the clock n is a sum of Qin(n−1)/2 and Qin(n−2)/2.

As a result of z-conversion of the expression 1, the following expression 2 is obtained as an expression that represents a relationship between Qout and Qin.

$$\frac{Qout(z)}{Qin(z)} = \frac{z^{-1} + z^{-2}}{2} \quad \text{[Expression 2]}$$

The above expression 2 shows that the FIR filter 500 shown in FIG. 1 is a 2-tap FIR filter.

In the charge domain FIR filter 500 shown in FIG. 1, eight sampling capacitors operate in four states of Reset, Charge, Hold and Share in a parallel cyclic manner with use of four phase clocks Φ1 to Φ4. Then, two sampling capacitors in the Share state are simultaneously connected to the output terminal OUT, thereby implementing a 2-tap FIR filter. Therefore, in the Share state, the addition of charges by connecting two sampling capacitors to each other and the output of a voltage signal by connecting two sampling capacitors to the output terminal OUT occur in parallel.

However, because an output signal from the Gm 502 varies constantly, an input signal to each capacitor differs by time phase. Accordingly, the amounts of charge accumulated in two sampling capacitors that are charged at different time phases are different. Then, if the sampling capacitors with different amounts of charge are connected to each other by a Share switch, transient movement of charge occurs between the capacitors when adding the charges. If a voltage signal is output from the output end in this state, a transient voltage waveform is output.

Further, not all of the potential of GND connected to the Reset switch of each sampling capacitor is completely 0V due to a potential difference in an IC constituting the FIR filter 500 or the like, and a potential difference exists among GNDs in some cases. In such cases, a common-mode voltage that is set in the Reset state slightly differs among the sampling capacitors, and charge accumulated in each capacitor differs according to the common-mode voltage.

Figure 4:
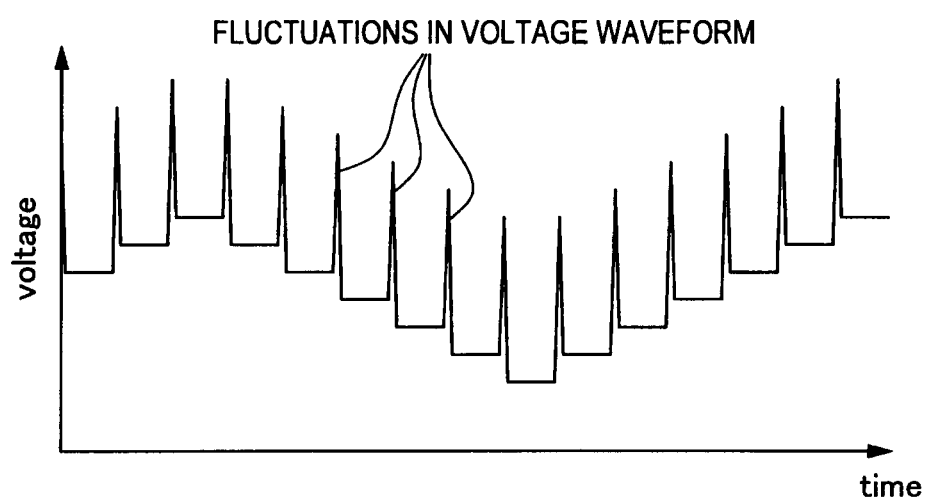
FIG. 4 is a characteristics chart showing fluctuations in a voltage waveform output to an output terminal OUT.

For the above factors, when exchanging charge between the sampling capacitors connected in the Share state, a transient phenomenon occurs before reaching a steady state, and fluctuations in a voltage waveform are output to the output terminal OUT. FIG. 4 is a characteristics chart showing fluctuations in a voltage waveform due to a transient phenomenon, in which the vertical axis indicates an output voltage from the output terminal OUT, and the horizontal axis indicates time. As shown in FIG. 4, fluctuations occur in the output voltage at the time of switching between Hi and Lo of the clocks Φ1 to Φ4.

As described above, in the charge domain FIR filter 500 shown in FIG. 1, eight sampling capacitors operate in four states of Reset, Charge, Hold and Share in a parallel cyclic manner with use of four phase clocks. Then, two sampling capacitors in the Share state are connected to the output terminal OUT. There is thus a problem that the transient phenomenon during addition of charges in the Share state is output as a voltage waveform.

(2) Structure and Operation of Filter Circuit According to First Embodiment

Figure 5:
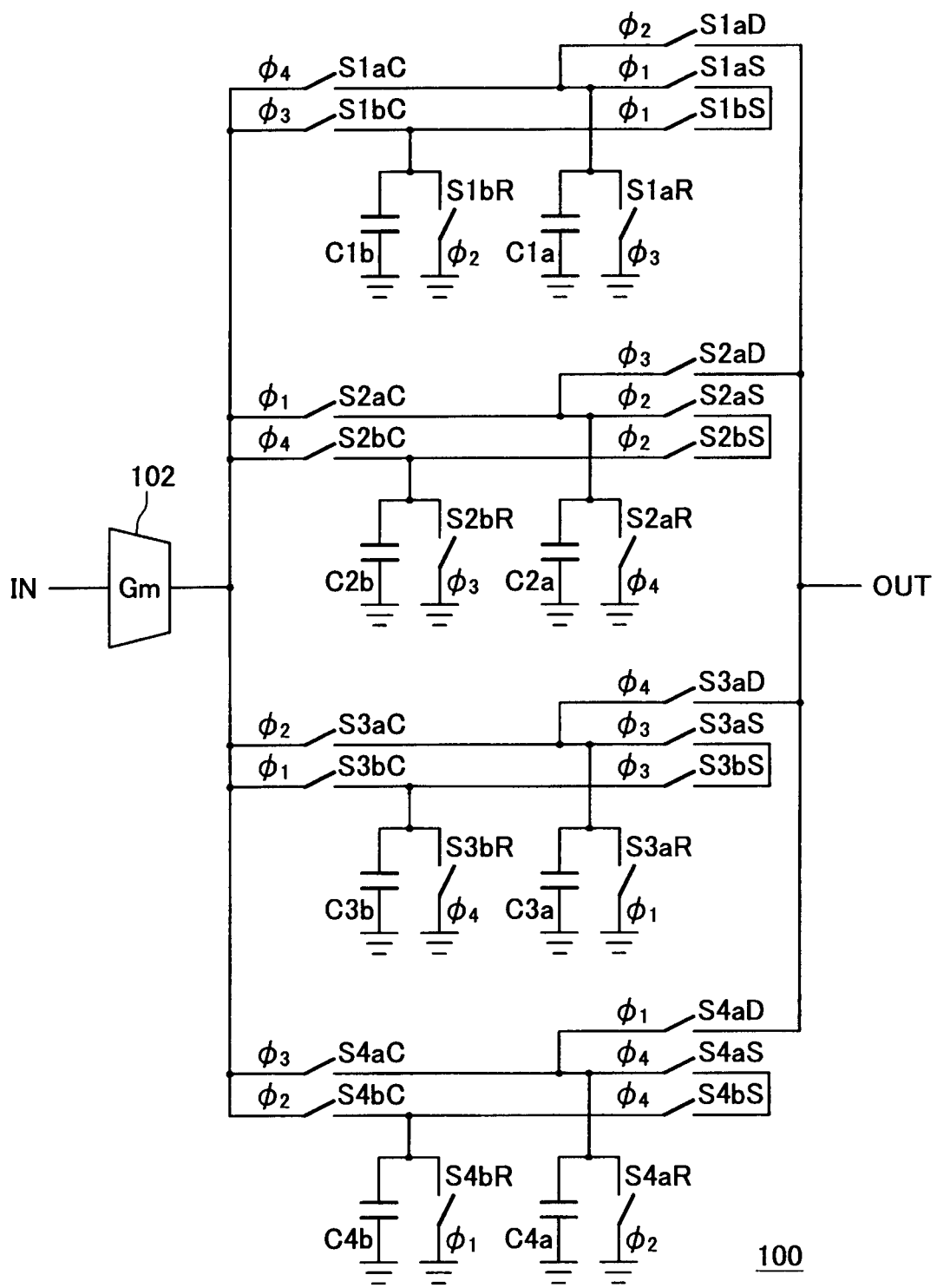
FIG. 5 is a circuit diagram showing the structure of a charge domain FIR filter according to a first embodiment of the present invention.

In view of the foregoing, it is desirable to provide a charge domain filter in which fluctuations in a voltage waveform as shown in FIG. 4 do not occur as a filter circuit according to an embodiment of the present invention. FIG. 5 is a circuit diagram showing the structure of a charge domain FIR filter 100 according to a first embodiment of the present invention. In FIG. 5, as in FIG. 1, IN is an input terminal, and OUT is an output terminal. A Gm 102 is a transconductance amplifier that converts a voltage signal applied to the input terminal IN to a current signal and outputs the signal. As in FIG. 1, eight sampling capacitors C1a, C1b, C2a, C2b, C3a, C3b, C4a and C4b, which constitute a capacitor group, are connected in parallel to the output end of the Gm 102. The sampling capacitors C1a, C1b, C2a, C2b, C3a, C3b, C4a and C4b all have the same capacitance C. As in FIG. 1, Reset switches S1aR, S2aR, S3aR and S4aR and Charge switches S1aC, S2aC, S3aC and S4aC are connected respectively to the sampling capacitors C1a, C2a, C3a and C4a. Further, Share switches S1aS, S2aS, S3aS and S4aS are connected respectively to the sampling capacitors C1a, C2a, C3a and C4a. In addition, in the charge domain FIR filter 100 according to the embodiment shown in FIG. 5, Dump switches S1aD, S2aD, S3aD and S4aD are connected respectively to the sampling capacitors C1a, C2a, C3a and C4a. In this manner, four kinds of switches are connected to the sampling capacitors C1a, C2a, C3a and C4a in the charge domain FIR filter 100 according to the embodiment.

On the other hand, Reset switches S1bR, S2bR, S3bR and S4bR, Charge switches S1bC, S2bC, S3bC and S4bC, and Share switches S1bS, S2bS, S3bS and S4bS are connected respectively to the sampling capacitors C1b, C2b, C3b and C4b. In this manner, three kinds of switches are connected to the sampling capacitors C1b, C2b, C3b and C4b, just like in FIG. 1.

The Reset switch, the Charge switch, the Share switch and the Dump switch shown in FIG. 5 are driven by clocks Φ1 to Φ4 indicated for the respective switches in FIG. 5. The Reset switch, the Charge switch, the Share switch and the Dump switch turn ON at the time phase when the clocks Φ1 to Φ4 become Hi-level. The time when the clocks Φ1 to Φ4 become Hi-level is the same as that in FIG. 2.

The sampling capacitors C1a, C2a, C3a and C4a enter any one of Reset state, Charge state, Share state and Dump state at the time phase when any one of the four kinds of switches connected to the sampling capacitor turns ON. Specifically, each sampling capacitor enters the Reset state at the time phase when the Reset switch connected to the capacitor turns ON, and enters the Charge state at the time phase when the Charge switch connected to the capacitor turns ON. Further, each sampling capacitor enters the Share state at the time phase when the Share switch connected to the capacitor turns ON, and enters the Dump state at the time phase when the Dump switch connected to the capacitor turns ON. Further, each sampling capacitor enters Hold state at the time phase when all switches connected to the sampling capacitor turn OFF.

On the other hand, the sampling capacitors C1b, C2b, C3b and C4b enter any one of Reset state, Charge state and Share state at the time phase when one of the three kinds of switches connected to the sampling capacitor turns ON. Further, the sampling capacitors C1b, C2b, C3b and C4b enter Hold state at the time phase when all switches connected to the sampling capacitors C1b, C2b, C3b and C4b turn OFF.

Figure 6:
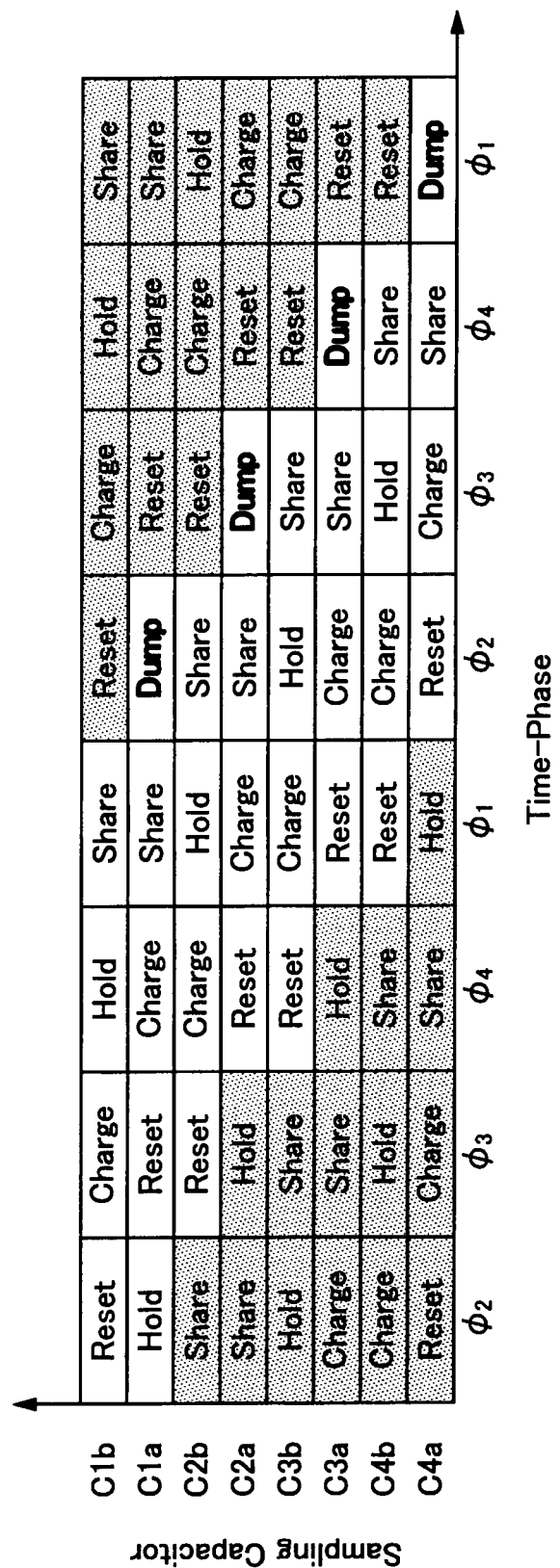
FIG. 6 is a schematic view showing a relationship between a time phase and a state in each sampling capacitor in the charge domain FIR filter of FIG. 5.

FIG. 6 is a schematic view showing a relationship between a time phase and a state in each sampling capacitor, in which the vertical axis indicates sampling capacitors and the horizontal axis indicates time phases. Hereinafter, the circuit operation is described by using a set of sampling capacitors C2b and C2a as an example. First, referring to FIG. 6 for the state of the sampling capacitor C2b, the Reset switch S2bR turns ON at the time when the clock Φ3 becomes Hi, and the sampling capacitor C2b enters the Reset state. The charge heretofore accumulated in the sampling capacitor C2b is thereby discharged. Next, when the Charge switches S2bC and S1aC turn ON at the time when the clock Φ4 becomes Hi, the sampling capacitor C2b, together with the sampling capacitor C1a, enters the Charge state, so that one half of the current supplied from the Gm 102 flows into the sampling capacitor C2b. Charge is thereby accumulated in the sampling capacitors C2b. Then, at the time when the clock Φ1 becomes Hi, all of the switches S2bR, S2bC and S2bS that are connected to the sampling capacitor C2b turn OFF, and the sampling capacitor C2b enters the Hold state. The charge accumulated in the sampling capacitor C2b is thereby held. After that, at the time when the clock Φ2 becomes Hi, the Share switches S2aS and S2bS turn ON, and the sampling capacitor C2b, together with the sampling capacitor C2a, enters the Share state. The two sampling capacitors C2b and C2a are thereby coupled, and the charges accumulated in the two sampling capacitors C2b and C2a are added together.

Likewise, the sampling capacitor C2a enters the Reset state when the Reset switch S2aR turns ON at the time when the clock Φ4 becomes Hi. The charge heretofore accumulated in the sampling capacitor C2a is thereby discharged. Next, when the Charge switches S2aC and S3bC turn ON at the time when the clock Φ1 becomes Hi, the sampling capacitor C2a, together with the sampling capacitor C3b, enters the Charge state, and one half of the current supplied from the Gm 102 flows into the sampling capacitor C2a. Charge is thereby accumulated in the sampling capacitors C2a. Then, at the time when the clock Φ2 becomes Hi, the Share switches S2aS and S2bS turn ON, and the sampling capacitor C2a, together with the sampling capacitor C2b, enters the Share state. The two sampling capacitors C2a and C2b are thereby coupled, and the charges accumulated in the two sampling capacitors C2a and C2b are added together.

In the charge domain FIR filter 100 according to the embodiment, after the charges of the two sampling capacitors C2a and C2b are added together, the Dump switch S2aD turns ON at the time when the next clock Φ3 becomes Hi. The sampling capacitor C2a is thereby connected to the output terminal OUT, and the charge accumulated in the sampling capacitors C2a flows into the output terminal OUT, so that an output waveform is obtained from the output terminal OUT. On the other hand, as for the sampling capacitor C2b, the Reset switch S2bR turns ON at the time when the clock Φ3 becomes Hi, and the accumulated charge is deleted and the sampling capacitor C2b enters the Reset state.

In the other sets of sampling capacitors (sampling capacitors C1a and C1b, sampling capacitors C3a and C3b, and sampling capacitors C4a and C4b) also, the same state transition is executed by shifting the time phase. Then, any of the sampling capacitors C1a, C2a, C3a and C4a is connected to the output terminal OUT of the FIR filter 100 in the Dump state, so that charge is output continuously without a break.

In the charge domain FIR filter 100 according to the embodiment shown in FIG. 5, the Dump switch is OFF during addition of charges in the Share state. Thus, no signal is output from the output terminal OUT while charges are added in the Share state. It is thereby possible to reliably inhibit an output waveform in the transient state as shown in FIG. 4 from being output from the output terminal OUT.

The Dump switch turns ON one time after the addition of charges in the Share state. In the Dump state, because the addition of charges is completed, the transient state occurring during the addition of charges already converges to a steady state. Therefore, by turning ON the Dump switch after completion of the Share state, a voltage signal waveform in the steady state can be output as it is from one of the capacitors whose charges have been added together. It is thereby possible to reliably prevent fluctuations in a voltage waveform due to the transient phenomenon from being output from the output terminal OUT.

Comparing FIG. 6 with FIG. 3, in the charge domain FIR filter 100 according to the embodiment shown in FIG. 6, the time phase which has been the Hold state in FIG. 3 is changed into the Dump state. Because an operation related to movement of charge such as accumulation or deletion of charge is not performed in the Hold state, differently from the Charge, Reset and Share states, no problem occurs when the Hold state is changed to the Dump state. Therefore, by changing the Hold period where the charge-accumulated state has been maintained to a signal output period in the Dump state, it is possible to obtain a suitable signal waveform with suppressed fluctuations in a waveform due to the transient phenomenon without adding another time phase.

In the circuit of FIG. 5, the charge accumulated one clock before and the charge accumulated two clocks before are added together in the Share state, and one half of the current supplied from the Gm 102 is accumulated as charge in each sampling capacitor. Thus, charge Qsum(n) that is added up at a time phase with a clock n in the Share state can be represented by the following expression 3.

$$Qsum(n) = \frac{Qin(n-1)}{2} + \frac{Qin(n-2)}{2} \quad \text{[Expression 3]}$$

Further, in the circuit of FIG. 5, there is no output from the output terminal in the Share state because the Dump switch is OFF, and, after one clock from the Share state, only one capacitor of the sampling capacitor pair is connected to the output terminal OUT. Therefore, charge Qout(n) that is output at the time with a clock n in the Dump state is ½ of the sum value represented by the expression 3, so that the following expression 4 is established.

$$Qout(n) = \frac{Qsum(n-1)}{2} \quad \text{[Expression 4]}$$

As described above, because charge is output from one of the sampling capacitors whose charges are added together in the circuit of FIG. 5, the amount of output charge is ½ compared to the expression 1. As a result of z-conversion of the expression 3 and the expression 4, the following expression 5 is obtained as an expression that represents a relationship between Qout and Qin.

$$\frac{Qout(z)}{Qin(z)} = \frac{z^{-2} + z^{-3}}{4} \quad \text{[Expression 5]}$$

As shown in the above expression 5, because the Dump state comes after the Share state in the circuit of FIG. 5, a delay of one clock cycle is added to the transfer function compared to the expression 2. The above expression 5 shows that the charge domain FIR filter 100 shown in FIG. 5 is also a 2-tap FIR filter. In the FIR filter 100 shown in FIG. 5, four capacitors operate in four states of Reset, Charge, Hold and Share in a parallel cyclic manner, and the other four capacitors operate in four states of Reset, Charge, Share and Dump in a parallel cyclic manner, respectively with use of four phase clocks. Then, only one sampling capacitor in the Dump state is connected to the output terminal OUT, thereby implementing a 2-tap FIR filter. Therefore, after addition of charges is performed in the Share state, a voltage that has reached the steady state is output from the output terminal OUT, so that a voltage waveform with no fluctuations can be obtained.

Figure 7:
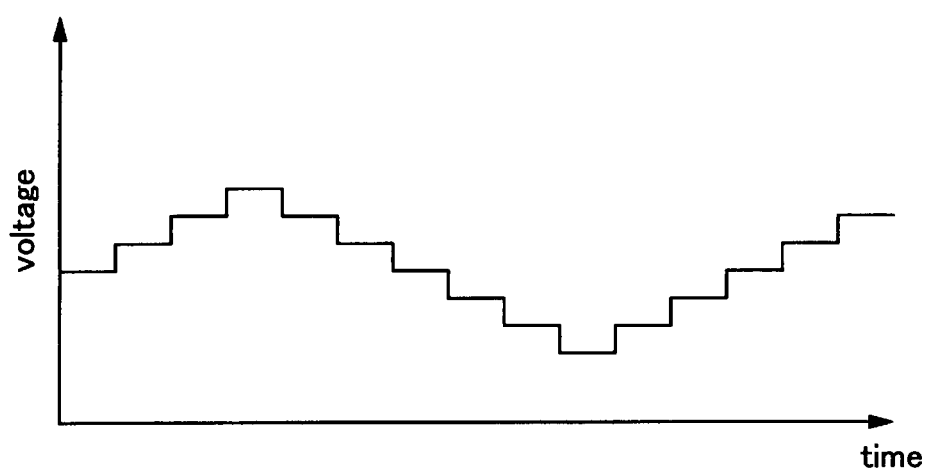
FIG. 7 is a characteristics chart showing an output waveform of the charge domain FIR filter according to the first embodiment of the present invention.

FIG. 7 is a characteristics chart showing an output waveform of the FIR filter 100 according to the embodiment, in which the vertical axis indicates an output voltage from the output terminal OUT, and the horizontal axis indicates time. As shown in FIG. 7, because a voltage that has reached the steady state after addition of charges in the Share state is output from the output terminal OUT, it is possible to reliably prevent fluctuations in a voltage waveform from occurring at the time of switching between Hi and Lo of the clocks Φ1 to Φ4.

Note that, although a voltage waveform is output from the output terminal OUT by the charge accumulated in one capacitor after addition of charges in FIG. 5, because the capacitance of the sampling capacitor related to the output is ½ compared to the case of FIG. 1, the output voltage value is the same as that of the circuit in FIG. 1.

As described above, according to the first embodiment, the Dump switch is placed between one of the capacitors whose charges are added together and the output terminal OUT, and the Dump switch turns ON one time after the charges are added together in the Share state. Therefore, by turning ON the Dump switch after completion of the Share state, a voltage signal waveform in the steady state can be output as it is from one of the capacitors whose charges are added together, and it is thereby possible to reliably suppress fluctuations in a voltage waveform due to the transient phenomenon.

2. Second Embodiment

Figure 8:
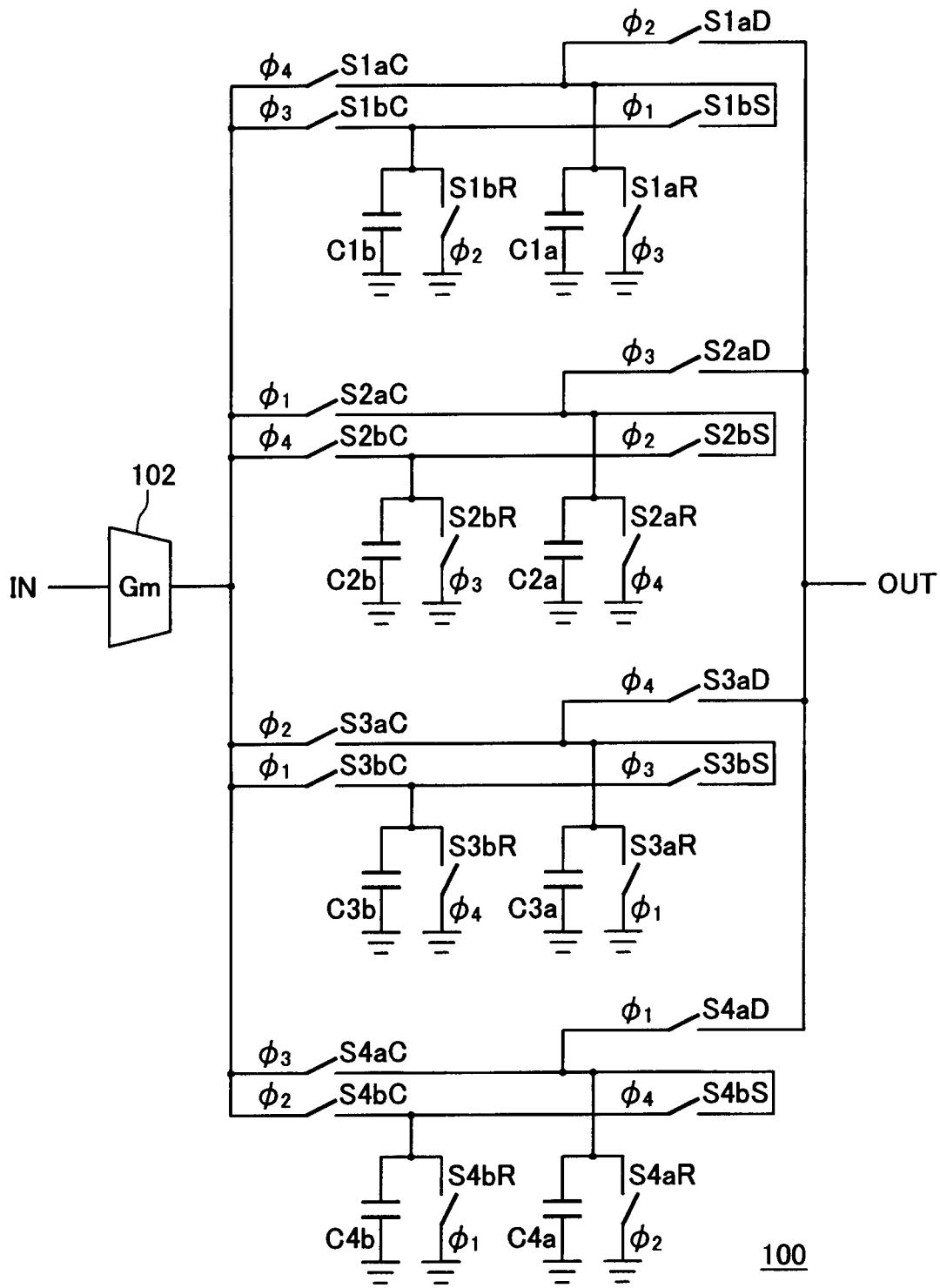
FIG. 8 is a circuit diagram showing the structure of a charge domain FIR filter according to a second embodiment of the present invention.

FIG. 8 is a circuit diagram showing the structure of a charge domain FIR filter 100 according to a second embodiment of the present invention. The charge domain FIR filter 100 shown in FIG. 8 is different from the charge domain FIR filter 100 shown in FIG. 5 in that the Share switches S1aS, S2aS, S3aS and S4aS are not included.

As shown in FIG. 8, Reset switches S1aR, S2aR, S3aR and S4aR and Charge switches S1aC, S2aC, S3aC and S4aC are connected respectively to the sampling capacitors C1a, C2a, C3a and C4a. Further, Dump switches S1aD, S2aD, S3aD and S4aD are connected respectively to the sampling capacitors C1a, C2a, C3a and C4a. In this manner, three kinds of switches are connected to the sampling capacitors C1a, C2a, C3a and C4a in the charge domain FIR filter 100 shown in FIG. 8.

On the other hand, Reset switches S1bR, S2bR, S3bR and S4bR, Charge switches S1bC, S2bC, S3bC and S4bC, and Share switches S1bS, S2bS, S3bS and S4bS are connected respectively to the sampling capacitors C1b, C2b, C3b and C4b. In this manner, three kinds of switches are connected to the sampling capacitors C1b, C2b, C3b and C4b.

The Reset switch, the Charge switch, the Share switch and the Dump switch shown in FIG. 8 are driven by clocks Φ1 to Φ4 indicated for the respective switches in FIG. 8. The Reset switch, the Charge switch, the Share switch and the Dump switch turn ON at the time phase when the clocks Φ1 to Φ4 become Hi-level. The time when the clocks Φ1 to Φ4 become Hi-level is the same as that in FIG. 2.

The sampling capacitors C1a, C2a, C3a and C4a enter any one of Reset state, Charge state and Dump state at the time phase when any one of the three kinds of switches connected to the sampling capacitor turns ON. Further, the sampling capacitors C1a, C2a, C3a and C4a enter the Share state at the time phase when all switches connected to the sampling capacitors C1a, C2a, C3a and C4a turn OFF.

On the other hand, the sampling capacitors C1b, C2b, C3b and C4b enter any one of Reset state, Charge state and Share state at the time phase when one of the three kinds of switches connected to the sampling capacitor turns ON. Further, the sampling capacitors C1b, C2b, C3b and C4b enter Hold state at the time phase when all switches connected to the sampling capacitors C1b, C2b, C3b and C4b turn OFF.

In the second embodiment, a relationship between a time phase and a state in each sampling capacitor is the same as that of the first embodiment shown in FIG. 6. Hereinafter, the circuit operation is described by using a set of sampling capacitors C2b and C2a as an example.

First, referring to FIG. 6 for the state of the sampling capacitor C2b, the Reset switch S2bR turns ON at the time when the clock L3 becomes Hi, and the sampling capacitor C2b enters the Reset state. The charge heretofore accumulated in the sampling capacitor C2b is thereby discharged. Next, when the Charge switches S2bC and S1aC. turn ON at the time when the clock Φ4 becomes Hi, the sampling capacitor C2b, together with the sampling capacitor C1a, enters the Charge state. One half of the current supplied from the Gm 102 thereby flows into the sampling capacitor C2b, and charge is accumulated in the sampling capacitors C2b. Then, at the time when the clock Φ1 becomes Hi, all of the switches S2bR, S2bC and S2bS that are connected to the sampling capacitor C2b turn OFF, and the sampling capacitor C2b enters the Hold state. After that, at the time when the clock Φ2 becomes Hi, the Share switch S2bS turns ON, and the sampling capacitor C2b, together with the sampling capacitor C2a, enters the Share state, and the charges accumulated in the two sampling capacitors C2b and C2a are added together.

Likewise, the sampling capacitor C2a enters the Reset state when the Reset switch S2aR turns ON at the time when the clock Φ4 becomes Hi. The charge heretofore accumulated in the sampling capacitor C2a is thereby discharged. Next, when the Charge switches S2aC and S3bC turn ON at the time when the clock Φ1 becomes Hi, the sampling capacitor C2a, together with the sampling capacitor C3b, enters the Charge state. One half of the current supplied from the Gm 102 thereby flows into the sampling capacitor C2a, and charge is accumulated in the sampling capacitors C2a. Then, at the time when the clock Φ2 becomes Hi, the Share switch S2bS turns ON, and the sampling capacitor C2a, together with the sampling capacitor C2b, enters the Share state, and the charges accumulated in the two sampling capacitors C2a and C2b are added together. After that, at the time when the clock Φ3 becomes Hi, the Dump switch S2aD turns ON, and the capacitors C2a and C2b are connected to the output terminal OUT.

In the other pairs of sampling capacitors also, the same state transition is executed by shifting the time phase. Then, any of the sampling capacitors C1a, C2a, C3a and C4a is connected to the output terminal OUT of the FIR filter 100, so that charge is output continuously without a break.

In the circuit shown in FIG. 5, the Share switches S1aS and S1bS, the Share switches S2aS and S2bS, the Share switches S3aS and S3bS, and the Share switches S4aS and S4bS perform the same operation at each time phase of Φ1 to Φ4. Thus, the Share switches S1aS, S2aS, S3aS and S4aS (or the Share switches S1bS, S2bS, S3bS and S4bS) can be eliminated to simplify the circuit structure.

In the circuit of FIG. 8 also, the charge accumulated one clock before and the charge accumulated two clocks before are added together in the Share state, and one half of the current supplied from the Gm 102 is accumulated as charge in each sampling capacitor. Thus, charge Qsum(n) that is added up at a time phase with a clock n in the Share state can be represented by the above expression 3 as in the first embodiment.

Further, in the circuit of FIG. 8 also, after one clock from the Share state, only one capacitor of the sampling capacitor pair is connected to the output terminal OUT. Therefore, charge Qout(n) that is output at the time with a clock n in the Dump state can be represented by the above expression 4 as in the first embodiment, and the above expression 5 can be obtained as a result of z-conversion of the expression 3 and the expression 4. It shows that the circuit of FIG. 8 is also a 2-tap FIR filter.

In the charge domain FIR filter 100 according to the second embodiment also, a voltage waveform with no fluctuations as shown in FIG. 7 can be output. Further, because the Share switches S1aS, S2aS, S3aS and S4aS in the circuit of FIG. 5 can be eliminated in the charge domain FIR filter 100 according to the second embodiment, the circuit structure can be simplified. It is thereby possible to add the Dump switches while maintaining the same number of switches as in the circuit of FIG. 1 where the Dump switches are not added, thereby implementing the circuit structure with no fluctuations in a voltage waveform.

As described above, according to the second embodiment, it is possible to implement the Dump state without increasing the number of switches in the case where the Dump state is added after the Share state just like in the first embodiment.

3. Third Embodiment

Figure 9:
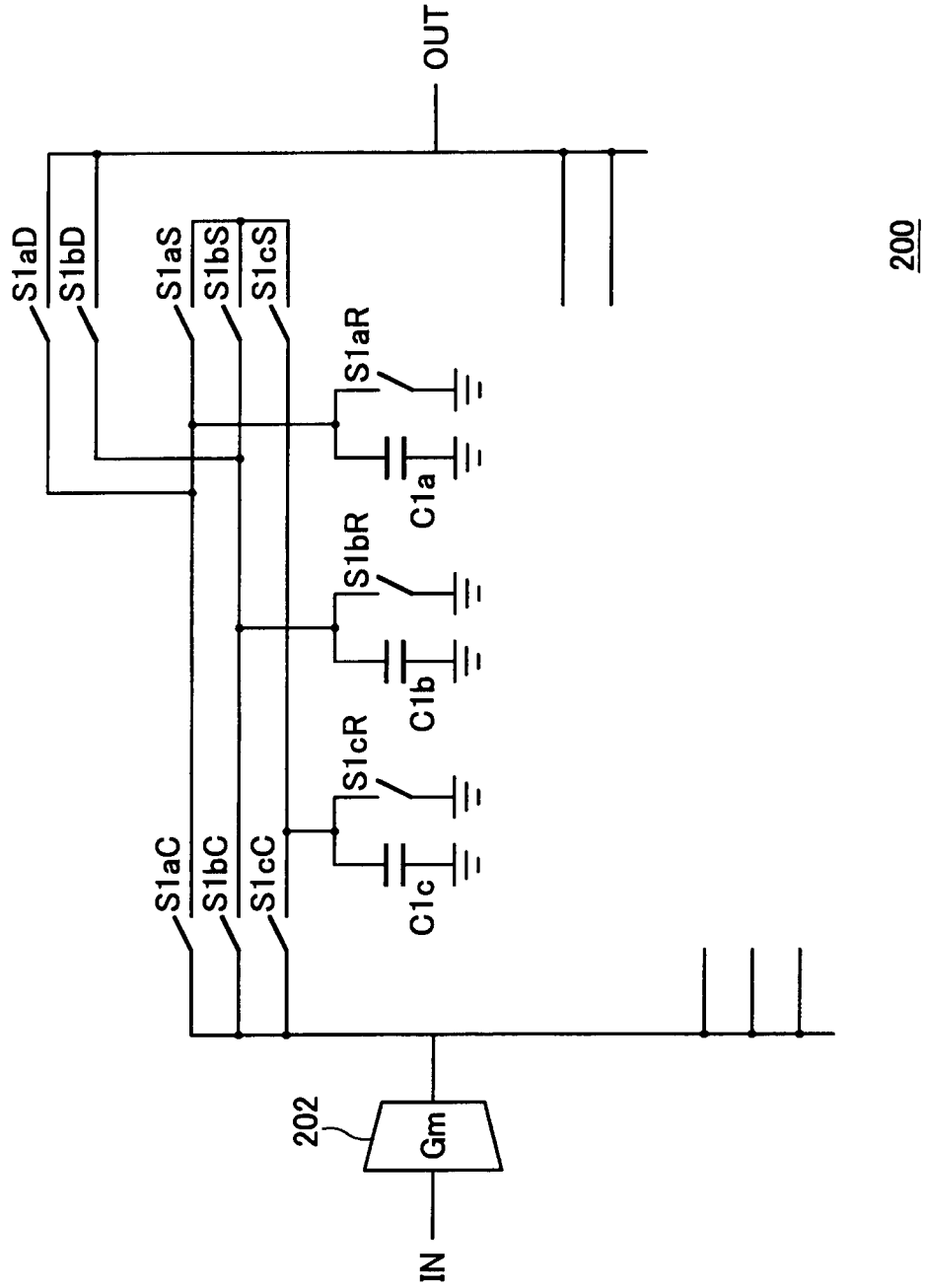
FIG. 9 is a circuit diagram showing a part of the structure of a charge domain FIR filter according to a third embodiment of the present invention.

A third embodiment of the present invention is described hereinbelow. FIG. 9 is a circuit diagram showing a part of the structure of a charge domain FIR filter 200 according to a third embodiment of the present invention. In the first embodiment and the second embodiment, the case where the present invention is applied to the 2-tap charge domain FIR filter 100 is described. In the third embodiment, the case where the present invention is applied to the 3-tap charge domain FIR filter 200 is described.

As shown in FIG. 9, in the charge domain FIR filter 200 according to the third embodiment, a sampling capacitor C1c that is connected in parallel with sampling capacitors C1a and C1b is added. A Reset switch S1cR, a Charge switch S1cC and a Share switch S1cS are connected to the sampling capacitor C1c. Further, a Dump switch S1aD is connected to the sampling capacitor C1a, and a Dump switch S1bD is connected to the sampling capacitor C1b. Although not shown in FIG. 9, in addition to the set of sampling capacitors C1a, C1b and C1c, a set of sampling capacitors C2a, C2b and C2c, a set of sampling capacitors C3a, C3b and C3c, a set of sampling capacitors C4a, C4b and C4c, and a set of sampling capacitors C5a, C51b and C5c are included in the FIR filter 200 according to the third embodiment, and a Reset switch, a Charge switch and a Share switch are connected to each of the sampling capacitors C2c, C3c, C4c and C5c, just like the sampling capacitor C1c. In an M-tap parallel cyclic type filter circuit, at least (M+2) number of sets of sampling capacitors are necessary.

The basic operation of the 3-tap FIR filter 200 shown in FIG. 9 is the same as the operation described in the first and second embodiments, and charge is accumulated in each sampling capacitor in every time phase, and charges are added by the Share switch. As for the set of sampling capacitors C1a, C1b and C1c as an example, after charge is accumulated sequentially in the sampling capacitors C1a, C1b and C1c at every time phase, the Share switches S1aS, S1bS and S1cS turn ON. The charges accumulated in the sampling capacitors C1a, C1b and C1c are thereby added together.

After that, in the Dump state, the Dump switches S1aD and S1bD turn ON, and the other switches turn OFF. The charges accumulated in the sampling capacitors C1a and C1b thereby flow into the output terminal OUT, so that output is obtained.

As for the other set of sampling capacitors C2a, C2b and C2c, set of sampling capacitors C3a, C3b and C3c, set of sampling capacitors C4a, C4b and C4c, and set of sampling capacitors C5a, C5b and C5c also, after the charges in the three capacitors are added together in the Share state, the Dump switches turn ON. An output waveform is thereby obtained based on the charges accumulated in the two capacitors. Although the Dump switch S1aD connected to the sampling capacitor C1a and the Dump switch S1bD connected to the sampling capacitor C1b are shown in FIG. 9, either one Dump switch may be included in the circuit.

In the circuit shown in FIG. 9 also, because the Dump switch turns ON after charges are added in the Share state, it is possible to prevent the transient phenomenon occurring when adding charges from appearing in the output. Therefore, by generating the output after reaching the steady state, a voltage waveform with no fluctuations as shown in FIG. 7 can be output.

Further, in FIG. 9, because three Share switches S1aS, S1bS and S1cS turn ON simultaneously in the Share state, it is possible to eliminate one switch by constantly maintaining the ON state of any one of the switches S1aS, S1bS and S1cS (e.g. the switch S1cS). This enables further simplification of the circuit structure.

Likewise, in an N-tap (N is an integer of two or above) FIR filter, after charges accumulated in the respective capacitors in a set of N-number of sampling capacitors are added together in the Share state, the Dump switch connected to the capacitor is turned ON. It is thereby possible to reliably suppress the effect of the transient phenomenon on an output waveform, thereby enabling output of a voltage waveform with no fluctuations.

Referring to FIG. 8, in the 2-tap FIR filter 100, one Share switch is eliminated so that one Share switch is placed for each pair of sampling capacitors. Referring also to FIG. 9, in the 3-tap FIR filter 200, one Share switch is eliminated so that two Share switches are placed for each set of sampling capacitors. Accordingly, in an N-tap FIR filter, N−1 number of Share switches can be placed for each set of sampling capacitors by eliminating one Share switch.

As described above, according to the third embodiment, in an N-tap (N is an integer of two or above) FIR filter, after charges accumulated in the respective sampling capacitors are added together in the Share state, the sampling capacitor is connected to the output terminal. It is thereby possible to reliably suppress the effect of the transient phenomenon on an output waveform, thereby enabling output of a voltage waveform with no fluctuations. Further, in a set of capacitors made up of N number of capacitors, by placing N−1 number of Share switches, it is possible to minimize the number of switches and simplify the circuit structure.

4. Fourth Embodiment

Figure 10:
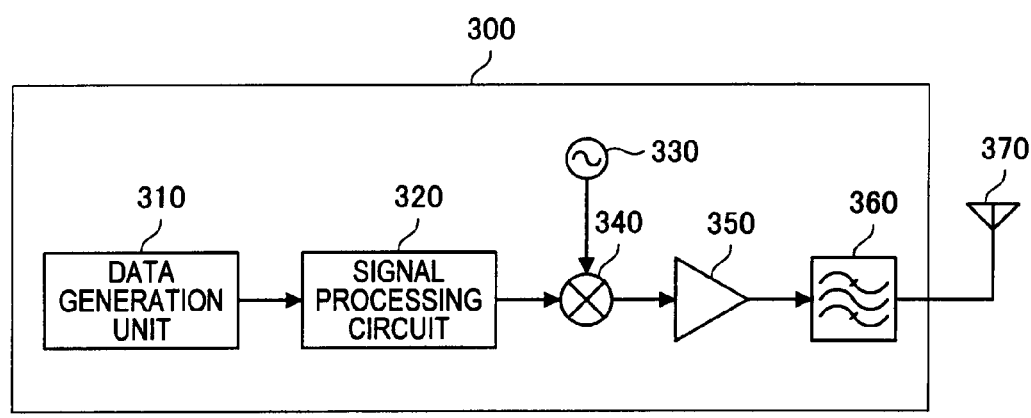
FIG. 10 is a schematic view showing the structure of a communication apparatus including a charge domain FIR filter according to each embodiment of the present invention.

A fourth embodiment of the present invention relates to a communication apparatus 300 that includes the charge domain FIR filter according to each embodiment described above. FIG. 10 is a schematic view showing the structure of the communication apparatus 300.

Referring to FIG. 10, the communication apparatus 300 according to the fourth embodiment includes a data generation unit 310, a signal processing circuit 320, a local signal generator 330, a frequency converter 340, a power amplifier 350, a band-limiting filter 360 and an antenna 370.

Data to be transmitted from the communication apparatus 300 is generated in the data generation unit 310 and then input to the signal processing circuit 320. In the signal processing circuit 320, processing such as D/A conversion, encoding and demodulation is performed to generate a baseband or intermediate frequency (IF) band transmission signal. The transmission signal from the signal processing circuit 320 is input to the frequency converter (mixer) 340 and then multiplied by a local signal from the local signal generator 330. As a result that the transmission signal is multiplied by the local signal, the transmission signal is frequency-converted, i.e. up-converted, to a radio frequency (RF) band signal.

The RF signal obtained as a result of the up-conversion in the frequency converter 340 is amplified by the power amplifier 350 and input to the band-limiting filter 360. The RF signal is then band-limited by the band-limiting filter 360 to remove an unnecessary frequency component and supplied to the antenna 370. The various kinds of charge domain FIR filters according to the respective embodiments described earlier can be used as the band-limiting filter 360.

As described above, according to the fourth embodiment, by using the FIR filter according to one of the first to third embodiments as the band-limiting filter 360 in the communication apparatus 300, it is possible to reliably inhibit fluctuations in a waveform from occurring in a signal supplied to the antenna 370.

Although the preferred embodiments of the present invention are described in detail above with reference to the drawings, the present invention is not limited thereto. It should be understood by those skilled in the art that various modifications, combinations, sub-combinations and alterations may occur depending on design requirements and other factors insofar as they are within the scope of the appended claims or the equivalents thereof.

The present application contains subject matter related to that disclosed in Japanese Priority Patent Application JP 2009-103165 filed in the Japan Patent Office on Apr. 21, 2010, the entire content of which is hereby incorporated by reference.

What is claimed is:

1. A filter circuit comprising;
   an input end,
   an output end;
   a voltage-current conversion unit that converts a voltage signal, supplied to the input end, to a current signal;
   a capacitor group comprising a plurality of sets of capacitors that receive the current signal from the voltage-current conversion unit at a plurality of equal and sequential time phases, the time phases comprising a cycle, and the number of time phases in the cycle being equal to the number of the sets;
   a plurality of first switches that provide the current signal to the capacitors of a first one of the sets during corresponding first time phases;
   a second switch that, during a second time phase subsequent to the first time phases, couples the capacitors of the first set, and adds the charge accumulated on the capacitors of the first set; and
   a third switch that, during a third time phase subsequent to the second time phase, couples at least one capacitor of the first set to the output end and provides the added charge to the output end, wherein:
   the third switch is n an OFF state during the first time phase; and
   the second switch is in the OFF state during the third time phase.

2. The filter circuit according to claim 1, further comprising:
   a plurality of fourth switches that delete the charge accumulated in the capacitors of corresponding sets, sequentially at every cycle.

3. The filter circuit of claim 1, further comprising a plurality of second switches that, during the second time phase, couple the capacitors of the first set and add the charge accumulated on the capacitors of the first set.

4. The filter circuit of claim 3, wherein the second switches are connected to corresponding ones of the capacitors of the first set.

5. The filter circuit of claim 1, wherein:
   the second switch is connected to a first one of the capacitors of the first set; and
   the third switch is connected to a second one of the capacitors of the first set.

6. The filter circuit of claim 1, wherein:
   during the second time phase, the second switch couples together a first subset of the first set of capacitors and adds the charge accumulated on the first subset; and during the third time phase, the third switch couples the first subset to the output end and provides the added charge to the output end.

7. The filter circuit of claim 1, wherein the third time phase occurs immediately after the second time phase.

8. A communication apparatus, comprising:
a unit that converts a voltage signal into a current signal; and
a filter circuit, comprising:
an input end that receives the current signal;
an output end;
a capacitor group comprising a plurality of sets of capacitors that receive the current signal from the voltage-current conversion unit at a plurality of equal and sequential time phases, the time phases comprising a cycle, and the number of time phases in the cycle being equal to the number of the sets;
a plurality of first switches that provide the current signal to the capacitors of a first one of the sets during corresponding first time phases;
a second switch that, during a second time phase subsequent to the first time phases, couples the capacitors of the first set, and adds the charge accumulated on the capacitors of the first set; and
a third switch that, during a third time phase subsequent to the second time phase, couples at least one capacitor of the first set to the output end and provides the added charge to the output end, wherein:
the third switch is in an OFF state during the first time phase; and
the second switch is in the OFF state during the third time phase.

9. The communication apparatus of claim 8, further comprising a voltage-current conversion unit that receives a voltage signal and converts the voltage signal into the current signal.

10. The communications apparatus of claim 8, wherein the filter circuit further comprises a plurality of fourth switches that sequentially deletes, at every cycle, the charge accumulated in the first set of capacitors.

11. The communication apparatus of claim 8, wherein the filter circuit further comprises a plurality of second switches that, during the second time phase, couple the capacitors of the first set and add the charge accumulated on the capacitors of the first set.

12. The communication apparatus of claim 11, wherein the second switches are connected to corresponding ones of the capacitors of the first set.

13. The communication apparatus of claim 8, wherein:
the second switch is connected to a first one of the capacitors of the first set; and
the third switch is connected to a second one of the capacitors of the first set.

14. The communication apparatus of claim 8, wherein:
during the second time phase, the second switch couples together a first subset of the first set of capacitors and adds the charge accumulated on the first subset; and
during the third time phase, the third switch couples the first subset to the output end and provides the added charge to the output end.

15. The communication apparatus of claim 8, wherein the third time phase occurs immediately after the second time phase.

* * * * *

UNITED STATES PATENT AND TRADEMARK OFFICE
CERTIFICATE OF CORRECTION

| | |
|---|---|
| PATENT NO. | : 8,633,617 B2 |
| APPLICATION NO. | : 12/757744 |
| DATED | : January 21, 2014 |
| INVENTOR(S) | : Iida et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 213 days.

Signed and Sealed this
First Day of September, 2015

Michelle K. Lee
*Director of the United States Patent and Trademark Office*